United States Patent
Chakravarty

(10) Patent No.: US 9,584,108 B2
(45) Date of Patent: Feb. 28, 2017

(54) APPARATUS FOR MANAGING CLOCK DUTY CYCLE CORRECTION

(71) Applicant: Sujoy Chakravarty, Bangalore (IN)

(72) Inventor: Sujoy Chakravarty, Bangalore (IN)

(73) Assignee: SILAB TECH PVT. LTD., Bangalore (IN)

( * ) Notice: Subject to any disclaimer, the term of this patent is extended or adjusted under 35 U.S.C. 154(b) by 0 days.

(21) Appl. No.: 14/859,654

(22) Filed: Sep. 21, 2015

(65) Prior Publication Data

US 2016/0087620 A1    Mar. 24, 2016

Related U.S. Application Data

(60) Provisional application No. 62/052,498, filed on Sep. 19, 2013.

(51) Int. Cl.
*H03K 7/08*    (2006.01)
*H03K 5/156*   (2006.01)

(52) U.S. Cl.
CPC .................. *H03K 5/1565* (2013.01)

(58) Field of Classification Search
CPC ........ H03K 7/06; H03K 23/68; H03K 23/667; H03K 7/08; H03K 5/01; H03K 5/04; H03K 5/1565
USPC ........................ 327/114, 115–117, 172–176
See application file for complete search history.

(56) References Cited

U.S. PATENT DOCUMENTS

| | | |
|---|---|---|
| 5,757,218 A | 5/1998 | Blum |
| 5,963,071 A | 10/1999 | Dowlatabadi |
| 6,426,660 B1 | 7/2002 | Ho et al. |
| 7,733,143 B2 | 6/2010 | Guo et al. |
| 7,969,224 B2 | 6/2011 | Werking |
| 8,680,907 B2 | 3/2014 | Chlipala et al. |
| 2005/0225370 A1* | 10/2005 | Harms .................. H03K 5/1565 327/175 |
| 2007/0159224 A1* | 7/2007 | Dwarka ............... H03K 5/1565 327/175 |
| 2008/0169855 A1* | 7/2008 | Shin ...................... H03K 5/1565 327/175 |

* cited by examiner

*Primary Examiner* — Long Nguyen

(57) ABSTRACT

Embodiments of the present invention disclose an apparatus for managing clock duty cycle. The apparatus comprises a Duty Cycle Control Circuit (DCCC) for receiving at least an input clock signal and generating an output clock signal with adjustable duty cycle, a first Low-Pass Filter with Pull-Up Resistor (LPFPR) for receiving the output clock signal with adjustable duty cycle and simultaneously averaging and raising the common mode of the output thereof, a frequency divider for generating a signal with a 50% duty cycle, a second LPFPR for receiving the generated signal with 50% duty cycle and simultaneously averaging and raising the common mode of the output thereof and an OPAMP for receiving the outputs of the first and second LPFPRs for generating an equivalent reference signal to be fed to the DCCC as a control input, thereby facilitating correction of the duty cycle of the input clock signal.

10 Claims, 4 Drawing Sheets

APPARATUS FOR MANAGING CLOCK DUTY CYCLE CORRECTION

CROSS-REFERENCE TO RELATED APPLICATIONS

This application claims the benefit of, and is a continuation-in-part of the following provisional application, which is hereby incorporated by reference in its entirety: U.S. Provisional Patent Application No. 62/052,498 captioned "METHOD AND APPARATUS FOR MANAGING CLOCK DUTY CYCLE CORRECTION (DCC)" filed Sep. 19, 2013.

BACKGROUND OF THE INVENTION

Field of the Invention

Embodiments of the present invention relate to managing timing in electronic circuits, and more particularly, to design and implementation of a Duty Cycle Correction Circuit (DCCC), thereby facilitating correcting the duty cycle of a clock signal and outputting a clock signal with a corrected duty cycle.

Description of the Related Art

Electronic systems are often implemented in a microelectronic circuit typically referred to as an Integrated Circuit (IC). The electronic systems typically include a number of passive and active electronic components, including but not limited to, transistors, resistors, capacitors, inductors, logic gates, linear amplifiers, voltage regulators, signal processors and converters, and the rest.

Many ICs generate an internal clock signal based on a received clock signal. A number of signal processing, data transfer, and other functions are performed employing the internal clock signal. For example, analog signals are converted into the digital domain, complicated signal processing functions are performed; digital signals are stored, high speed data transfer operations are performed, and the like.

The reliable generation of the internal clock signals is an important aspect of IC design, especially with increasing clock frequencies. Compensation of external and internal non-ideal characteristics of the received and generated clock signals prevent operating inefficiencies and other complications in electronic systems.

As many clock driven digital systems are required to perform at higher speeds, designers are investigating different options to achieve the high speed operation. Designers may decide to use both the rising and the falling edge of a given clock signal to double the total number of operations. However, the usage of both the rising and the falling edge of a given clock signal to double the total number of operations requires a clock to output accurate 50% duty-cycle to prevent or reduce jitters and other timing related aberrations.

At relatively low frequencies of clock signals, one method to provide a desired symmetrical clock signal uses a conventional flip-flop circuit to perform an equivalent division-by-two for deriving an output clock signal frequency. As per the aforementioned method, the source clock frequency must be two times faster than the desired circuit design operating frequency. However, as frequencies increase, the source clock frequency will reach the technology limitation before reaching the circuit design operating frequency. Conventional methods or topologies that have been proposed do not generate a very accurate multiply-by-2 output frequency because some of these methods use a digital controller to select a fixed number of delays. In the case of varying duty-cycles, using a fixed number of delays is not effective to generate accurate multiply-by-2 output frequencies.

However, there is still a need for enhanced methods, apparatuses and systems for managing clock Duty Cycle Correction (DCC).

SUMMARY

Embodiments of the present invention disclose an apparatus for managing clock duty cycle. The apparatus comprises a Duty Cycle Control Circuit (DCCC) for receiving at least an input clock signal and generating an output clock signal with adjustable duty cycle, a first Low-Pass Filter with Pull-Up Resistor (LPFPR) for receiving the output clock signal with adjustable duty cycle and simultaneously averaging and raising the common mode of the output thereof, a frequency divider for generating a signal with a 50% duty cycle, a second LPFPR for receiving the generated signal with 50% duty cycle and simultaneously averaging and raising the common mode of the output thereof and an OPAMP for receiving the outputs of the first and second LPFPRs for generating an equivalent reference signal to be fed to the DCCC as a control input, thereby facilitating correction of the duty cycle of the input clock signal.

The output of the OPAMP is fed back as input to the DCCC. The DCCC comprises a first inverter, a Low-Pass Filter (LPF), an Alternating Current (AC) Coupling Capacitor (ACCC), a second inverter and a High-Gain Multi-Stage Single-Ended R2R Buffer (HGMSSER2RB). The HGMSSER2RB comprises at least a plurality of even-number inverters. The HGMSSER2RB facilitates reconstruction of a square wave with a non-sinusoidal periodic waveform. The LPF facilitates slowing down the rise and fall of the input clock signal, thereby generating a modified clock signal. The ACCC facilitates AC coupling of the modified clock signal with the second inverter via passage of only AC component of the modified clock signal. The at least one input of the DCCC is fed with the output of the OPAMP, thereby facilitating formation of a feedback path such that the at least one input of the DCCC serves as the control input for the DCCC, and wherein the control input facilitates setting the common mode of the DC component of the AC coupled modified clock signal. Each of the first and second LPFPRs comprises at least a LPF and a pull-up resistor, thereby facilitating reducing the design complexity of OPAMPs via usage of an NMOS input pair. Each of the first and second LPFPRs comprises at least a LPF and a pull-down resistor, thereby facilitating reducing the design complexity of OPAMPs via usage of a PMOS input pair.

In some advantageous embodiments, deployment and implementation of at least one of one or more pull-up and pull-down resistors in the first and second LPFPRs facilitates reduction or minimization in the design complexity of OPAMPs with the usage of at least one of NMOS and PMOS input pair, in that order. On the contrary, exclusion of least one of one or more pull-up and pull-down resistors in the first and second LPFPRs facilitates generation of a voltage level, for instance VDD/2, which is neither suitable for design of OPAMPs with of at least one of NMOS and PMOS input pair, in that order.

Figure 1:
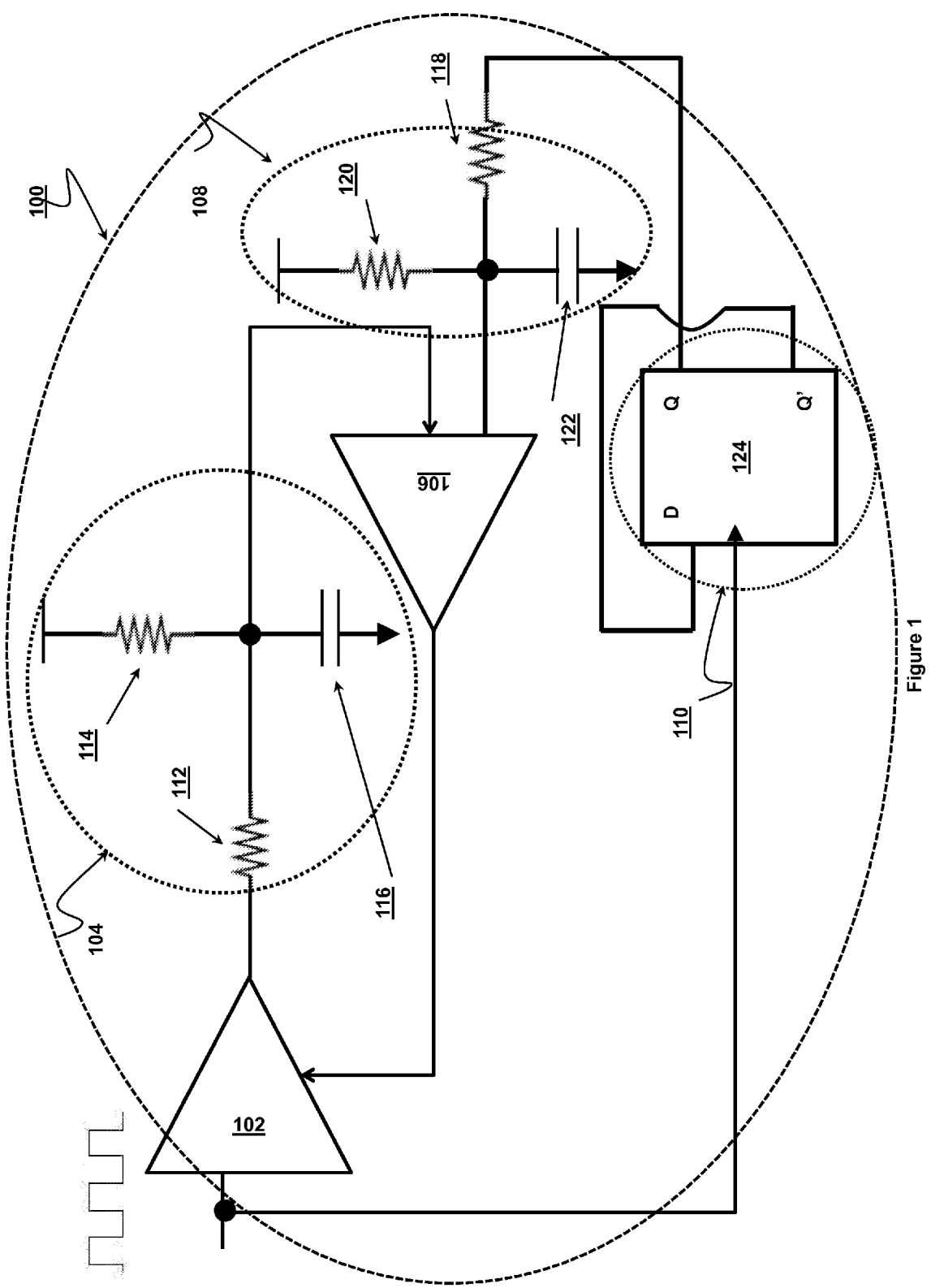
FIG. 1 depicts a block diagram of an apparatus for managing clock duty cycle, according to one or more embodiments.

While the method and apparatus is described herein by way of example for several embodiments and illustrative drawings, those skilled in the art will recognize that apparatus for managing clock Duty Cycle Correction (DCC) is not limited to the embodiments or drawings described. It should be understood, that the drawings and detailed description thereto are not intended to limit embodiments to the particular form disclosed. Rather, the intention is to cover all modifications, equivalents and alternatives falling within the spirit and scope of apparatus for managing clock Duty Cycle Correction (DCC) defined by the appended claims.

DETAILED DESCRIPTION

Various embodiments of apparatus for managing clock duty cycle correction (DCC) are described. In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Embodiments of the present invention disclose an apparatus for managing clock duty cycle. The apparatus comprises a Duty Cycle Control Circuit (DCCC) for receiving at least an input clock signal and generating an output clock signal with adjustable duty cycle, a first Low-Pass Filter with Pull-Up Resistor (LPFPR) for receiving the output clock signal with adjustable duty cycle and simultaneously averaging and raising the common mode of the output thereof, a frequency divider for generating a signal with a 50% duty cycle, a second LPFPR for receiving the generated signal with 50% duty cycle and simultaneously averaging and raising the common mode of the output thereof and an OPAMP for receiving the outputs of the first and second LPFPRs for generating an equivalent reference signal to be fed to the DCCC as a control input, thereby facilitating correction of the duty cycle of the input clock signal.

The output of the OPAMP is fed back as input to the DCCC. The DCCC comprises a first inverter, a Low-Pass Filter (LPF), an Alternating Current (AC) Coupling Capacitor (ACCC), a second inverter and a High-Gain Multi-Stage Single-Ended R2R Buffer (HGMSSER2RB). The HGMSSER2RB comprises at least a plurality of even-number inverters. The HGMSSER2RB facilitates reconstruction of a square wave with a non-sinusoidal periodic waveform. The LPF facilitates slowing down the rise and fall of the input clock signal, thereby generating a modified clock signal. The ACCC facilitates AC coupling of the modified clock signal with the second inverter via passage of only AC component of the modified clock signal. The at least one input of the DCCC is fed with the output of the OPAMP, thereby facilitating formation of a feedback path such that the at least one input of the DCCC serves as the control input for the DCCC, and wherein the control input facilitates setting the common mode of the DC component of the AC coupled modified clock signal. Each of the first and second LPFPRs comprises at least a LPF and a pull-up resistor, thereby facilitating reducing the design complexity of OPAMPs via usage of an NMOS input pair. Each of the first and second LPFPRs comprises at least a LPF and a pull-down resistor, thereby facilitating reducing the design complexity of OPAMPs via usage of a PMOS input pair.

FIG. 1 depicts a block diagram of an apparatus for managing clock duty cycle, according to one or more embodiments.

As used in general, the term "duty cycle" refers to the percentage of one period in which a signal is active. A period is the time it takes for a signal to complete an on-and-off cycle. The duty cycle may be represented by the following Equation 1:

$$D=(T/P)*100\%, \text{ where } D \text{ is the duty cycle, } T \text{ is the time the signal is active, and } P \text{ is the total period of the signal.} \quad \text{Equation 1}$$

Thus, for example, a 60% duty cycle means the signal is on 60% of the time but off 40% of the time. The "on time" for a 60% duty cycle may be a fraction of a second, a day, or even a week, depending on the length of the period.

The apparatus 100 comprises a Duty Cycle Control Circuit (DCCC) 102, a first Low-Pass Filter with Pull-Up Resistor (or LPFPR or RC network) 104, an Operational Amplifier (OPAMP) 106, a second Low-Pass Filter with Pull-Up Resistor (or LPFPR or RC network) 108 and a frequency divider 110.

Figure 2:
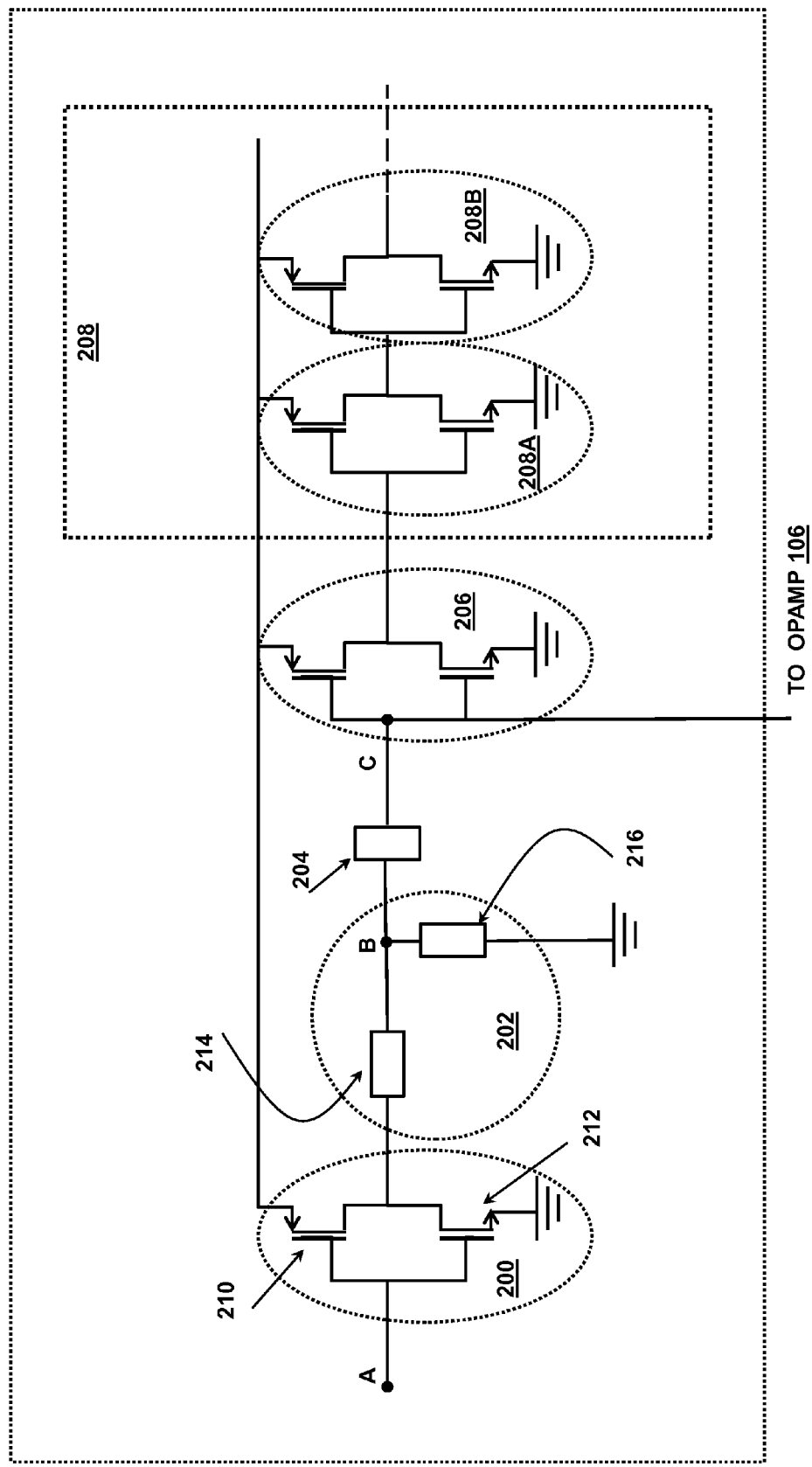
FIG. 2 depicts an exploded view of the circuitry in connection with the DCCC facilitating controlling the duty cycle of the input clock signal, according to one or more embodiments.

FIG. 2 depicts an exploded view of the circuitry in connection with the DCCC facilitating controlling the duty cycle of the input clock signal, according to one or more embodiments.

With reference to FIGS. 1-2, the DCCC 102 comprises a first inverter 200, a LPF 202, an Alternating Current (AC) Coupling Capacitor (ACCC) 204, a second inverter 206 and a High-Gain Multi-Stage Single-Ended R2R Buffer (HGMSSER2RB) 208 comprising at least a plurality of inverters, namely 208A, 208B . . . 208N.

The first inverter 200 comprises a PNP transistor 210 and a NPN transistor 212.

The first inverter 200 is fed with an input clock signal.

The first inverter 200 is coupled to the LPF 202.

The LPF 202 comprises a resistor 214 and a capacitor 216.

The LPF 202 facilitates passage of signals with frequencies lower than a certain cutoff frequency and attenuates signals with frequencies higher than the cutoff frequency. The LPF 202 facilitates slowing down the rise and fall of the input clock signal, thereby generating a modified clock signal.

The input of the ACCC 204 is fed with the modified clock signal.

The ACCC 204 facilitates AC coupling of the modified clock signal, i.e. passage of only AC component of the modified clock signal, with the second inverter 206.

The second inverter 206 comprises a PNP transistor 218 and a NPN transistor 220 (not shown here explicitly).

The input to the second inverter 206 is fed with the AC component of the modified clock signal.

The DC component of the modified signal is set by the OPAMP 106, of FIG. 1.

The HGMSSER2RB 208 facilitates reconstruction of the square wave with a non-sinusoidal periodic waveform. Specifically, the HGMSSER2RB 208 comprises the plurality of the inverters 208A, 208B . . . 208N, wherein the total number of the inverters 208A, 208B . . . 208N is even.

Figure 3:
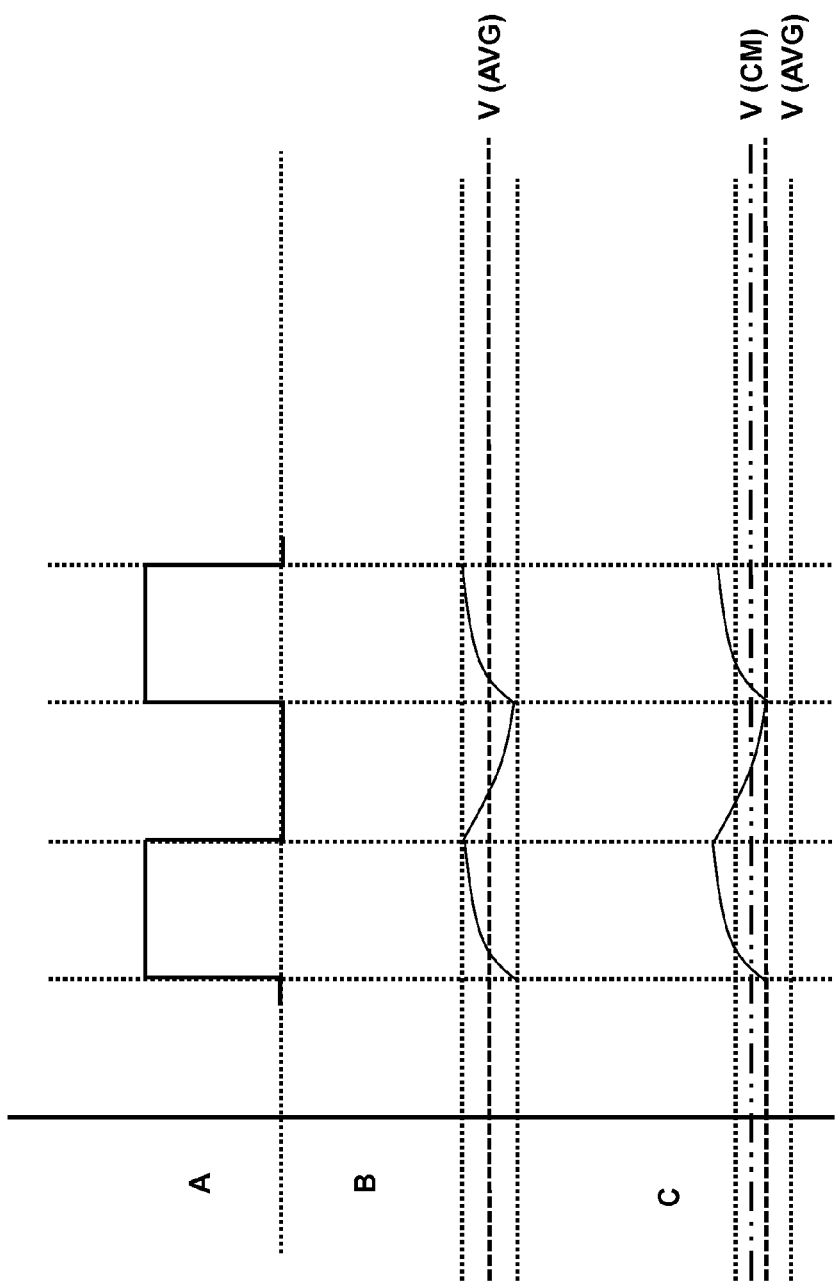
FIG. 3 depicts distinct initial, intermediary and terminal points in the circuitry in connection with the DCCC, thereby facilitating illustration of the different stages the input clock signal is subjected to and the corresponding transformations therein, according to one or more embodiments.

FIG. 3 depicts distinct initial, intermediary and terminal points in the circuitry in connection with the DCCC, thereby facilitating illustration of the different stages the input clock signal is subjected to and the corresponding transformations therein, according to one or more embodiments.

With reference to FIGS. 1-3, and as depicted in FIG. 3, at a distinct initial point, namely A, in the proximity of the input of the first inverter 200 the input clock signal is fed as a square wave with a non-sinusoidal periodic waveform. Noteworthy here is the fact that the duty cycle of the input clock signal is not necessarily 50%.

Again, with reference to FIGS. 1-3, and as depicted in FIG. 3, at a distinct intermediary point, namely B, upon completion of the process of modifying the input clock signal by the LPF 202, the output is a clock signal with slowed down transition times. Specifically, a dotted line, namely Voltage (Average) or V (AVG), represents the average voltage value in connection with the averaged clock signal.

Yet again, with reference to FIGS. 1-3, and as depicted in FIG. 3, likewise upon completion of AC coupling of the modified clock signal by the ACCC 204, i.e. passage of only AC component of the modified clock signal, to the second inverter 206, the clock signal appears as represented at a distinct intermediary point, namely C. At the distinct intermediary point C, the DC component of the modified signal is set by the OPAMP 106, of FIG. 1.

With reference to FIGS. 1-3, the Low-Pass Filter (LPFs) of the LPF 202, first and second LPFPRs 104 and 108 facilitate passage of signals with frequencies lower than a certain cutoff frequency and attenuates signals with frequencies higher than the cutoff frequency. The amount of attenuation for each frequency depends on the filter design.

In operation, the pull-up resistors of the first and second LPFPRs 104 and 108 weakly pulls the voltage of the wire connected thereto towards the voltage source level thereof.

Referring back to FIG. 1, a first input of the DCCC 102 is fed with an input clock signal. For example, and in no way limiting the scope of the invention, the input clock signal is a square wave or a non-sinusoidal periodic waveform, wherein the amplitude of the square wave alternates at a steady frequency between fixed minimum and maximum values. Noteworthy here is the fact that the duty cycle of the input clock signal is not necessarily 50%.

A second input of the DCCC 102 is fed with the output of the OPAMP 106, thereby forming a feedback path or loop. The second input of the DCCC 102 serves as a control for the DCCC 102.

The DCCC 102 generates an output clock signal with adjustable duty cycle.

The first LPFPR 104 comprises a first resistor 112, a second resistor 114 and a first capacitor 116.

The output of the DCCC 102 is coupled to the first LPFPR 104. Specifically, the output of the DCCC 102 is coupled to a first terminal of the first resistor 112 of the first LPFPR 104, and fed as the input.

A first terminal of the first capacitor 116 is coupled to a signal ground. A second terminal of the first capacitor 116 is coupled to both the first and second resistors 112 and 114. Specifically, the second terminal of the first capacitor 116 is coupled to a second terminal of the first resistor 112 and a first terminal of the second resistor 114. The second terminal of the second resistor 114 is coupled to a supply voltage (VDD).

In operation, the first LPFPR 104 facilitates simultaneous signal averaging and raising the common mode.

The first LPFPR 104 is coupled to the OPAMP 106. Specifically, the output of the first LPFPR 104 is fed to a first input of the OPAMP 106.

The first input of the OPAMP 106 is coupled to a first electrical junction of the first LPFPR 104. Likewise, a second input of the OPAMP 106 is coupled to a second electrical junction of the second LPFPR 108. The output of the OPAMP 106 is coupled to the second input of the DCCC 102.

The second LPFPR 108 comprises a third resistor 118, a fourth resistor 120 and second capacitor 122.

An electrical junction of the second LPFPR 108 is coupled to the frequency divider 110.

In some embodiments, the frequency divider 110 is implemented using a Delay (D) flip-flop 124. Specifically, a second terminal of the third resistor 118 of the second LPFPR 108 is coupled to an output terminal (Q) of the D flip-flop 124.

An inverted output terminal (Q' or NOT Q) of the D flip-flop 124 is coupled back to a data or delay input terminal of the D flip-flop 124. As shown in FIG. 1, the coupling back of the Q' terminal of the D flip-flop 124 back to the data or delay input terminal of the D flip-flop 124 comprises a feedback loop.

Figure 4:
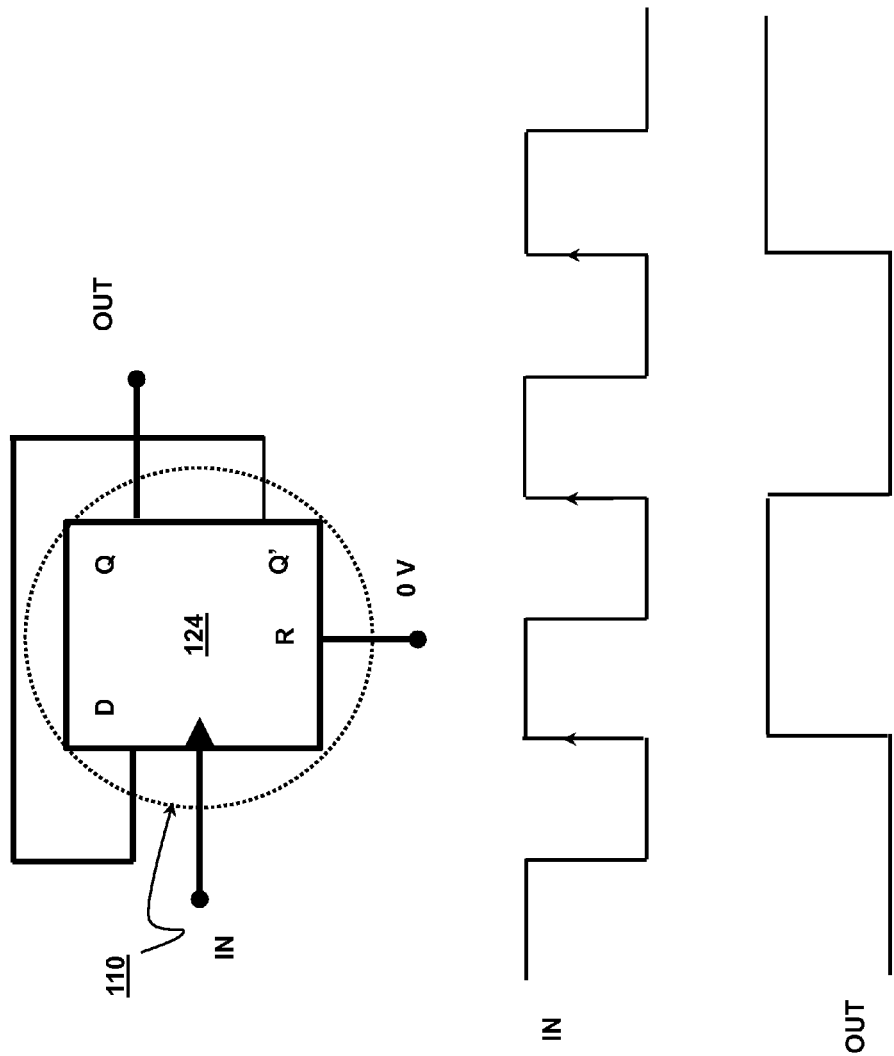
FIG. 4 depicts a comparative analysis of an exemplary or a sample square waveform in connection with an input clock (IN) and a corresponding output signal (Q or OUT) of the D flip-flop, according to one or more embodiments.

FIG. 4 depicts a comparative analysis of an exemplary or a sample square waveform in connection with an input clock (IN) and a corresponding output signal (Q or OUT) of the D flip-flop, according to one or more embodiments.

For purposes of clarity and expediency, the operation of the frequency divider 110 is implemented using the Delay (D) flip-flop 124, of FIG. 1, is illustrated in conjunction with FIG. 4. In operation, the inverted output terminal Q' is at 1 in the event that the output Q of the Delay (D) flip-flop 124 is at 0. On the first rising edge of the input clock signal IN, the output signal Q changes to 1. The output signal Q stays at 1 as the input clock signal IN pulse falls to 0. Upon the input clock signal IN next pulse, the rising edge causes the output signal Q to change to 0. The output signal Q changes every other input clock signal IN pulse.

Referring back to FIG. 1, a first terminal of the second capacitor 122 is coupled to a signal ground. A second terminal of the second capacitor 122 is coupled to both the third and fourth resistors 118 and 120. Specifically, the second terminal of the second capacitor 122 is coupled to a first terminal of the third resistor 118 and first terminal of the fourth resistor 120. A second terminal of the fourth resistor 120 is coupled to a supply voltage (VDD).

A second input of the OPAMP 106 is coupled to the second electrical junction of the second LPFPR 108.

Each of the first and second RC networks 104 and 108 facilitate realization of a low pass filter coupled to pull-up resistor.

In some advantageous embodiments, deployment and implementation of at least one of one or more pull-up and pull-down resistors in the first and second LPFPRs facilitates reduction or minimization in the design complexity of OPAMPs with the usage of at least one of NMOS and PMOS input pair, in that order. On the contrary, exclusion of least one of one or more pull-up and pull-down resistors in the first and second LPFPRs facilitates generation of a voltage level, for instance VDD/2, which is neither suitable for design of OPAMPs with of at least one of NMOS and PMOS input pair, in that order.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

The invention claimed is:

1. An apparatus for managing clock duty cycle comprising:
   a Duty Cycle Control Circuit (DCCC) for receiving at least an input clock signal and generating an output clock signal with adjustable duty cycle;
   a first Low-Pass Filter with Pull-Up Resistor (LPFPR) for receiving the output clock signal with adjustable duty cycle and simultaneously averaging and raising the common mode of the output thereof;
   a frequency divider for generating a signal with a 50% duty cycle;
   a second LPFPR for receiving the generated signal with 50% duty cycle and simultaneously averaging and raising the common mode of the output thereof; and
   an OPAMP for receiving the outputs of the first and second LPFPRs for generating an equivalent reference signal to be fed to the DCCC as a control input, thereby facilitating correction of the duty cycle of the input clock signal.

2. The apparatus of claim 1, wherein the output of the OPAMP is fed back as input to the DCCC.

3. The apparatus of claim 1, wherein the DCCC comprises a first inverter, a Low-Pass Filter (LPF), an Alternating Current (AC) Coupling Capacitor (ACCC), a second inverter and a High-Gain Multi-Stage Single-Ended R2R Buffer (HGMSSER2RB).

4. The apparatus of claim 3, wherein the HGMSSER2RB comprises at least a plurality of even-number inverters.

5. The apparatus of claim 4, wherein the HGMSSER2RB facilitates reconstruction of a square wave with a non-sinusoidal periodic waveform.

6. The apparatus of claim 3, wherein the LPF facilitates slowing down the rise and fall of the input clock signal, thereby generating a modified clock signal.

7. The apparatus of claim 3, wherein the ACCC facilitates AC coupling of the modified clock signal with the second inverter via passage of only AC component of the modified clock signal.

8. The apparatus of claim 1, wherein at least one input of the DCCC is fed with the output of the OPAMP, thereby facilitating formation of a feedback path such that the at least one input of the DCCC serves as the control input for the DCCC, and wherein the control input facilitates setting the common mode of the DC component of the AC coupled modified clock signal.

9. The apparatus of claim 1, wherein each of the first and second LPFPRs comprises at least a LPF and a pull-up resistor, thereby facilitating reducing the design complexity of OPAMPs via usage of an NMOS input pair.

10. The apparatus of claim 1, wherein each of the first and second LPFPRs comprises at least a LPF and a pull-down resistor, thereby facilitating reducing the design complexity of OPAMPs via usage of a PMOS input pair.

* * * * *